United States Patent [19]

Hiai et al.

[11] Patent Number: 5,019,423
[45] Date of Patent: May 28, 1991

[54] EQUIPMENT AND METHOD FOR SUPPLY OF ORGANIC METAL COMPOUND

[75] Inventors: Atsuhiko Hiai, Takaishi; Kazuo Wakimura, Sennan, both of Japan

[73] Assignee: Mitsui Toatsu Chemicals, Inc., Japan

[21] Appl. No.: 289,807

[22] Filed: Dec. 21, 1988

[30] Foreign Application Priority Data

Dec. 24, 1987 [JP] Japan .................. 62-325385

[51] Int. Cl.$^5$ ............................................ C23C 16/00
[52] U.S. Cl. ............................ 427/248.1; 34/22; 118/726
[58] Field of Search .............. 34/12, 10, 57 A, 57 R; 118/720, 726; 427/255.6, 248.1, 252, 250

[56] References Cited

U.S. PATENT DOCUMENTS 2,701,901 2/1955 Pawlyk ............................ 427/252 X
2,738,762 3/1956 Pawlyk ............................ 427/252 X

FOREIGN PATENT DOCUMENTS 787076 12/1957 United Kingdom .

Primary Examiner—Henry A. Bennet
Attorney, Agent, or Firm—Sixbey, Friedman, Leedom & Ferguson

[57] ABSTRACT

Supply equipment for providing a stable supply of feed gas of an organic metal compound at a constant concentration comprises a cylindrical vessel with an organic metal compound housed, an inlet tube of carrier gas for vaporizing said organic metal compound, an outlet tube for letting out the carrier gas substantially saturated with the vaporized organic metal compound, a room provided in the lower part of the vessel which is connected to said carrier gas inlet tube, a packed bed of an organic metal compound formed above said room, and a partition with a plurarity of pores partitioning said room and said packed bed.

10 Claims, 2 Drawing Sheets

EQUIPMENT AND METHOD FOR SUPPLY OF ORGANIC METAL COMPOUND

BACKGROUND OF THE INVENTION

1. Field of the Invention

The present invention relates to supply equipment for providing a stable supply of a solid organic metal compound in gaseous form which is a starting material for the formation of semiconductor film, superconductor film or the like of the compound.

The invention is also concerned with a method for providing a stable supply of a solid organic metal compound in gaseous form by using the supply equipment.

2. Description of the Prior Art

In recent years, the vapor deposition method in gaseous phase using an organic metal compound has remarkably progressed for film formation of semiconductor, super conductor or the like of the compound. Compound semiconductors are prepared by such methods as the so-called MOCVD (metal organic chemical vapor deposition) and MOMBE (metal organic molecular beam epitaxy methods). Using high-grade film controlling technique according to such methods, high-capacity semiconductor lasers, for example, are produced on a trial basis, some of which are now at a stage of large-scale production. Extensive studies have also been done on the formation of semi-conductors that have physical properties never existing in nature by artificially controlling the film on the level of atom layer. It is expected that such semiconductors will soon be in practical use.

Vessels for supplying to the film-formation apparatus vapor of an organic metal compound which is a starting material for the film of semiconductor, for example, by transporting it by the use of the vapor pressure by means of carrier gas (shown in FIG. 4) usually involve introducing through a capillary carrier gas that is inert to said organic metal compound into the liquid organic metal compound and collecting it after removed from the vessel in association with said carrier gas.

Heretofore, organic metal compounds that are solid at ordinary temperature such as, for example, trimethylindium (m.p. 88.4° C.) in general have been treated by the use of sublimation pressure in a vessel similar to the one for organic metal compounds that are solid at ordinary temperature.

In the vapor deposition method for forming film, for example, of compound semiconductor or superconductor using an organic metal compound in gaseous phase it is desired to provide stable and continuous supply in gaseous phase to the film-formation apparatus of vaporized organic metal compound feed which compound is solid or liquid in nature.

There has been in the prior-art method using a vessel as shown in FIG. 4 when a solid organic metal compound is used as the starting material a problem that the carrier gas is apt to be ventilated through crystals of the starting material thereby causing channelling with a result that outlet vapor is not a saturated one. Poor controllability due to variation in flow rate of the carrier gas and low stability in the degree of saturation have also been problematic.

Such unstability behaviors occurred more frequently as the organic metal compound was used more with less amount remained in the vessel. Therefore, they produced bad influence upon controllability and reproducability in the film-formation reaction using a gaseous organic metal compound.

The object of the invention is to provide equipment for supplying, for example, to film-formation equipment, feed gas substantially saturated with an organic metal compound in a constant concentration of the saturated gas at a stable flow rate even when flow rate of the carrier gas or remaining amount of the organic compound in the vessel are changed and a method for providing such supply.

SUMMARY OF THE INVENTION

According to the present invention, there is provided supply equipment for the stable supply of a feed gas of an organic metal compound at a constant concentration which comprises a cylindrical vessel with an organic metal compound housed therein, an inlet tube of carrier gas for vaporizing said organic metal compound, an efferent tube for letting out the carrier gas substantially saturated with the vaporized organic metal compound, a room provided in the lower part of the vessel which is connected to said carrier gas inlet tube, a packed bed of an organic metal compound formed above said, and a partition with a plurality of pores partitioning said room and said packed bed, thereby the carrier gas introduced into said room being passed through said partition to said packed bed for substantially saturing said gas with the organic metal compound. The present invention also contemplates a method for providing a stable supply of feed gas substantially saturated with an organic metal compound which comprises soaking the above-mentioned equipment in a thermostatic chamber, introducing carrier gas through a carrier gas introduction tube maintained at a constant temperature sufficient to vaporize said organic metal compound, and flowing said carrier gas through said packed bed to vaporize said organic metal compound thereby substantially saturating the gas with the compound.

DETAILED DESCRIPTION OF THE INVENTION

The invention will be described in more details below.

As the organic metal compound in the present invention are mentioned organic metal compounds that are liquid at ordinary temperature such as triethylaluminum, trimethylgallium, triethylgallium, dimethylzinc, diethylzinc, triethylindium, trimethylarsenic, dimethylcadmium, tetramethintin and dimethyltellurium; and organic metal compounds that are solid at ordinary temperature such as biscyclopentadienylmagnesium, dicyclopentadienylmanganese, bismethylcyclopentadienylmagnesium, acetylacetonestrontium, bispentadienylstrontium, dimethoxystrontium, trimethylindium, dimethoxybarium, acetylacetonebarium, biscyclopentadienylbarium, trimethoxylanthanum, acetylacetonelanthanum, triscyclopentadienyllanthanum, trismethylcyclopentadienyllanthanum, trimethoxyyttrium, acetylacetoneyttrium and triscyclopentadienylyttrium. Particularly preferable are the latter organic metal compounds which are solid at ordinary temperature.

As the carrier gas used in the invention are mentioned those which are inert to the above-mentioned organic metal compounds such as, for example, hydrogen, nitrogen, argon and helium. Pressure of the gas is as high as about 200–2000 Torr. It is to be noted that the pressure will approximately be equal to pressure of the vessel in use.

The carrier gas is introduced from the room below the bottom of the packed bed, flowed through the packed bed in association with vapor of an organic metal compound and removed out of the system from the top of the packed tower.

An important matter is that it is especially preferable to maintain the carrier gas to be introduced into the packed bed at a temperature necessary for vaporizing the organic metal compound. Temperature range for the carrier gas is variable depending upon vapor pressure of said organic metal compound and may be appropriately selected in accordance with the vapor pressure. Usually, it is about in the range between 0° and 100° C. In order to meet the above requirement, the introduction tube for carrier gas is constructed in such a manner that it is capable of being exchanged in contact with the heating medium as is the body of the vessel placed in a thermostatic chamber. Thus, such construction more advantageously enables stable supply of the gas saturated with vapor of the organic metal compound. Heating means by an electric heater or an infrared heater may be employed in place of the heating medium provided that it is capable of maintaining the vessel at a predetermined temperature. The thermostatic chamber as referred to in the invention is intended to cover those which are operated by such various heating means. Descriptions will be given below with reference to a thermostatic chamber as representative of these thermostatically heating means.

Preferred embodiments of the invention will further be described in details with reference to attached drawings.

Figure 1:
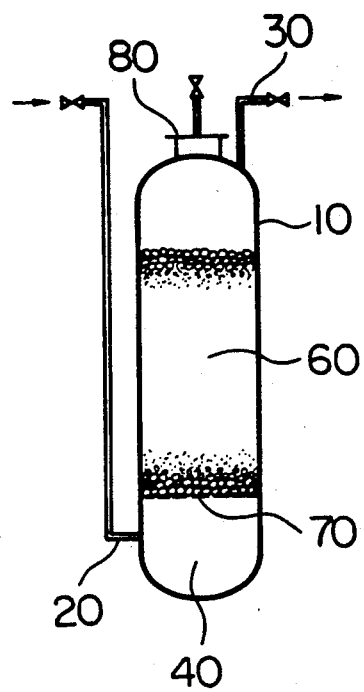
FIG. 1 is a schematic view showing an example of structure of the vessel according to the invention.

FIG. 1 is a schematic view showing structure of an example of the organic metal compound vessels according to the invention. The drawing, however, is not intended to limit the invention in any way.

As shown in FIG. 1, the vessel in the invention comprises the cylindrical vessel 10 in which the organic metal compound 60 is housed, the introduction tube 20 for carrier gas to vaporize said organic metal compound and the efferent tube 30 for removing the carrier gas substantially saturated with the vaporized organic metal compound.

In the lower part of the vessel is provided the room 40 which is connected with said carrier gas introduction tube. Above said room is formed the organic metal compound packed bed 60. Said room is partitioned by the partition (or holding plate) 70 having a plurality of pores from said packed bed. Carrier gas introduced into said room is delivered through said partition 70 to said organic metal compound packed bed 60 and passed through it. The vessel is constructed in such a manner that the carrier gas is substantially saturated with the organic metal compound while passing through the packed bed and removed through the efferent tube 30 at the top of said vessel.

In using such vessel for stable supply of the feed gas substantially saturated with an organic metal compound, first a vessel as described above is preferably soaked in the thermostatic chamber.

Said thermostatic chamber is filled with heating medium at a predetermined temperature, in which the inlet tube 20 for carrier gas for vaporizing said organic metal compound is soaked. The carrier gas supplied from said introduction tube is heat exchanged with said medium and heated to a temperature necessary for vaporizing said organic metal compound. It is then introduced through the introduction tube into the room 40 in the vessel. It is preferred that said room occupies about 1–20% of the entire volume of the vessel. Said carrier gas is flowed through a large number of pores into the packed bed and vaporizes said organic metal compound while flowing through said packed bed, thereby being substantially saturated with the compound. The gas saturated with the vaporized organic metal compound is removed through the carrier gas efferent tube 30 at the top. The carrier gas inlet tube 20 may be provided at the top of the cylindrical vessel and directly hung downward in parallel with the wall inside the cylindrical vessel in such a way that outlet of the end is inserted in the void 40.

It is preferred that the organic metal compound in the invention is a solid material about 0.1–5 mm in size. Bed packed with it is readily formed by pouring the solid material of said organic metal compound from the top of the cylindrical vessel. Preferably, there is provided the feed packing port 80 from which the feed solid material is poured. The poured organic metal compound is then held on the partition or holding plate 70 installed in the lower part of the vessel and accumulated on it to form a packed bed. Carrier gas which has been heat exchanged with the medium 90 by passing through the carrier gas introduction tube 20 and then through the partition 70 to be heated to a temperature necessary for vaporizing said organic metal compound comes into contact with the compound within the packed bed 60 and is led out of the system through the saturated vapor efferent tube 30. The saturated vapor of the organic metal compound thus produced is used for the preparation of film of a semiconductor or a superconductor.

The partition or holding plate 70 is in the shape of, for example, mesh, perforated plate or multipore plate. It may be in any shape and in any material and appropriately selected provided that it can support the packed bed formed by the solid organic metal compound, have a large number of pores and allow for easy flow of the carrier gas. Diameter of the pore is preferably about 0.1–1 mm, and number of the pore is about 10–200. It is preferred that the partition is firmly adhered to the wall of the cylindrical vessel by welding. If the organic metal compound is liquid, no partition is needed, and such means as connecting the end of the gas introduction tube to the multipore plate may instead by employed. As clearly seen from examples of the invention described below, the invention produces especially remarkable results in general when an organic metal compound that is solid at ordinary temperature is employed.

Figure 3:
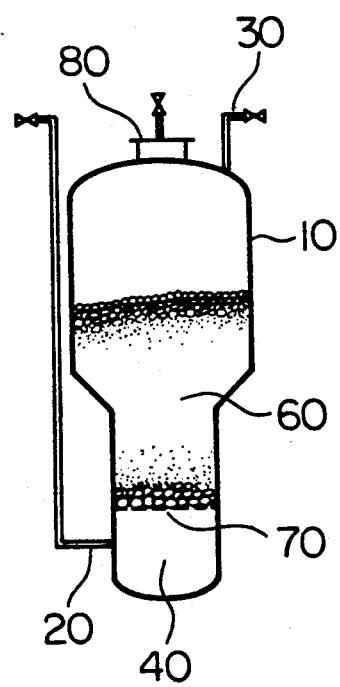
FIG. 3 is a schematic view showing structure of the vessel of a shape in which the upper part is larger than the lower part.
Figure 5:
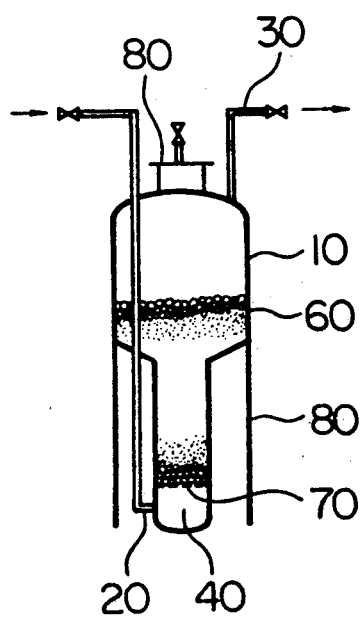
FIG. 5 is a schematic view of the vessel of FIG. 3 which is additionally equipped with a skirt with the same diameter as that of the upper part of the vessel in order to assure stability in installation.

The cylindrical vessel used in the invention may also be a cylinder having a larger diameter in the upper part than in the lower part as shown in FIG. 3. It is preferred in view of processability in fabrication and easiness in supplying and packing the solid organic metal compound that the upper part of the vessel have a diameter larger than that of the lower part to some extent. Moreover, it is preferable for the upper part to have a larger diameter than that of the lower part also in order to decrease gas flow rate to avoid association of fine particles of the solid organic metal compound with the carrier gas out of the vessel. Also, relatively small diameter of the part for the packed bed at least facilitates prevention of channelling of the carrier gas to result in its uniform contact with the organic metal compound. As shown in FIG. 3, it is preferred to provide taper at the connection between the upper part of a larger diameter and the lower part of a smaller diameter so as to allow for smooth supply of the solid organic metal compound flowing downward. FIG. 5 is a vessel according to FIG. 3 in which the skirt 82 of the same diameter as that of the upper part of the vessel is accessorized to improve setting stability.

In the vessel of the invention, the carrier gas introduction tube 20 and the saturated vapor efferent tube 30 are firmly adhered to the cylindrical vessel, for example, by welding. Desirably there is further provided a gas circuit breaker such as valve. Also, the feed supply port 80 at the top of the vessel is firmly adhered to the vessel and is preferably equipped with such a breaker such as valve. When an organic metal compound in around such an amount as used in examples given below is housed and treated, diameter of the cylinder is typically about 0.5–6 cm, and more specifically about 1–3 cm, although there is no limitation in numerical value. If the upper part is a cylinder of a larger diameter, typically, diameter of the lower cylinder is about 0.5–4 cm, more specifically about 1–3 cm, and larger diameter of the upper cylinder is about 2–10 cm, more specifically about 3–7 cm. It is preferred that H/R=about 1–20 wherein H represents effective height of the vessel and R represents diameter of the cylinder. Volume of the vessel V is preferably about 50–10,000 ml.

Quality of material for the vessel is not limited to any one, and the material may be of either glass, resin or metal provided that it is inert to the organic metal compound to be housed therein. Usually, metals in general are acceptable in consideration of such factors as safety during transportation. Among them is preferable stainless steel. Such a grade of stainless steel as SUS304 or SUS316 is satisfactory.

Heretofore, so-called semiconductor gas such as silane or germane is filled in bomb and commercially supplied from manufacturer to user. The user in turn can have stable supply of semiconductor gas by connecting said bomb in pipe arrangement via such an instrument as a mass flow controller to the production equipment for semiconductor film.

Figure 4:
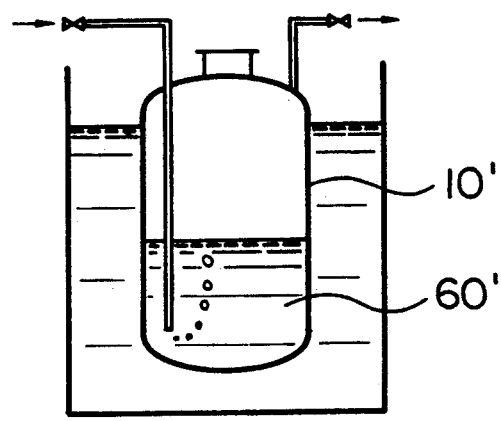
FIG. 4 is a schematic view showing a prior-art vessel.

Unlike the so-called semiconductor gas such as silane or germane, however, organic metal compounds, for example, solid trimethylindium is commercially supplied in a vessel of the shape as shown in FIG. 4, and therefore it is difficult to have stable supply of the feed vapor at a constant concentration from the vessel. This is because a stable supply of the feed gas would by no means be feasible by setting of the vessel by the user in a thermostatic chamber as shown in FIG. 4, passing a carrier gas to the vessel to vaporize the feed and supplying the vapor to production equipment for semiconductor film. As described above, and also as clearly seen from comparative examples, stable supply of the feed vapor at a constant concentration can by no means be achieved, leaving a big problem to users for the manufacturing semiconductor equipment.

Figure 2:
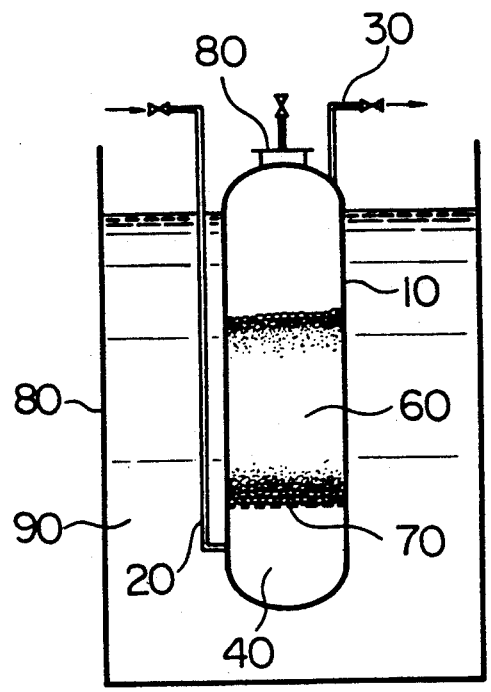
FIG. 2 is a schematic view showing the vessel placed in a thermostatic chamber.

According to the vessel of the invention for supplying feed vapor of an organic metal compound, on the contrary, there is housed in tight sealing in a cylindrical vessel as shown in FIG. 1, an organic metal compound in the form of a packed bed which is preferable solid. The feed gas in the form of housed in tight sealing in a bomb is commercially supplied to users in entirely the same manner as the current supply of semiconductor gas filled in a bomb. Therefore, as shown in FIG. 2, the bomb is soaked in a thermostatic chamber together with a carrier gas introduction tube, a gas efferent tube is connected to equipment for the production of semiconductor film, and carrier gas is introduced into the system. Only such arrangements very easily allow for stable supply of the feed gas for forming the film at a constant concentration substantially independent of quantities of the carrier gas and the organic metal. Such supply could be as easy as supply of silane gas from bomb. It is to be noted that the vessel of the invention as shown in FIG. 1 which is used in technical field of semiconductor film manufacturing is transacted in such an amount of organic metal compound housed in tight sealing as several grams to ten and some grams, at most several hundred grams. It is therefore to be recognized that the vessel is small enough to be readily transported.

EXAMPLES

Example 1

In a SUS316 vessel (38 mm in diameter, 150 mm in height and 150 ml in inner volume) was filled 50 g of trimethylindium. As the partition wall was used a perforated plate (1 mm in pore size x 50). The vessel was soaked in a thermostatic chamber set or 10° C. or 20° C., and high-purity hydrogen as carrier gas was supplied at a rate of 10 ml/min, by means of a mass flow controller. After the system reached steady state, outlet gas was catched with 1N aqueous HCl for 30 min. to decompose trimethylindium, and indium concentration in said solution was analyzed by ICP analysis (induction coupling plasma emission spectrophotometry) to determine degree of saturation against theoretical value for trimethylindium in the outlet gas. Results are shown in Table 1.

COMPARATIVE EXAMPLE 1

An experiment was run in the same way as in Example 1 except that a prior-art vessel shown in FIG. 4 was used. Results are shown in Table 1.

TABLE 1

| Set Temperature | Example-1 | Comparative Example-1 |
|---|---|---|
| 10° C. | 0.97 | 0.79 |
| 20° C. | 0.96 | 0.71 |

EXAMPLE 2

In a SUS316 vessel according to the invention (38 mm in diameter of the upper cylindrical part, 13 mm in diameter of the lower cylindrical part, 50 mm in length of the lower part and 90 ml in inner volume) was filled 20 g of trimethylindium. As the partition was employed a perforated plate (1 mm in pore size x 15). The vessel was soaked in a thermostatic chamber set at 10° C. or 20° C. and high-purity hydrogen as carrier gas was supplied at a rate of 10 ml/min. After the system reached steady state, outlet gas was catched with 1N aqueous HCl for 30 min. to decompose trimethylindium. Indium concentration in said solution was analyzed by TCP analysis (induction coupling plasma emission spectrophotometry) to determine degree of saturation against theoretical value for trimethylindium in the outlet gas. Results are shown in Table 2.

COMPARATIVE EXAMPLE 2

An experiment was run in the same way as in Example 2 except that a prior-art vessel (38 mm in diameter, 150 mm in height and 150 ml in inner volume) was used. Results are shown in Table 2.

TABLE 2

| Set Temperature | Example-2 | Comparative Example-2 |
| --- | --- | --- |
| 10° C. | 0.99 | 0.84 |
| 20° C. | 0.98 | 0.72 |

EXAMPLE 3

The vessel used in Example 2 filled with 20 g of trimethylindium was soaked in a thermostatic chamber maintained at 10° C. The upper saturated vapor efferent tube was connected to gas chromatography (called GC for short). The carrier gas was flowed in the same way as in Example 1. Concentration of the trimethylindium was measured for 2 hours after the system became steady. Results are shown in Table 3.

COMPARATIVE EXAMPLE 3

An experiment was run in the same way as in Example 3 except that the vessel used in Comparative Example 1 was employed. The vapor did not reach saturated state due to channelling of the carrier gas and other conditions. Results are shown in Table 3.

TABLE 3

| Time elapsed (min) | Peak height in GC Example-3 | Comparative Example-3 |
| --- | --- | --- |
| 0 | 89 | 72 |
| 15 | 90 | 74 |
| 30 | 91 | 72 |
| 45 | 91 | 74 |
| 60 | 88 | 77 |
| 75 | 90 | 76 |
| 90 | 90 | 78 |
| 105 | 90 | 80 |
| 120 | 90 | 78 |
| Mean | 89.5 | 75.2 |
| Standard deviation | 1.23 | 2.89 |

EXAMPLE 4

Relationship between amount of filled trimethylindium and degree of saturation for the outlet gas against theoretical value was determined in an experiment carried out in the same way as in Example 2 in a thermostatic chamber maintained at 10° C. Stable production of the saturated vapor was achieved with trimethylindium in a remaining amount up to about 3 g. Results are shown in Table 4.

COMPARATIVE EXAMPLE 4

An experiment was run in the same way as in Example 4 except that the vessel of Comparative Example 1 was used. The vapor concentration was generally low and variable. Results are shown in Table 4.

TABLE 4

| Amount filled | Example-4 | Comparative Example-4 |
| --- | --- | --- |
| 1 | 0.94 | 0.61 |
| 3 | 0.98 | 0.54 |
| 6 | 0.99 | 0.73 |
| 9 | 1.00 | 0.88 |
| 12 | 0.98 | 0.85 |
| 15 | 1.01 | 0.76 |
| 20 | 0.99 | 0.84 |

EXAMPLE 5

Concentration of trimethylindium was measured in the same way as in Example 3 except that the temperature of the thermostatic chamber was changed to 20° C. and the flow rate of the carrier gas was changed stepwise from 10 ml/min. to 100 ml/min. while monitoring the outlet gas by GC. Results are shown in Table 5.

COMPARATIVE EXAMPLE 5

An experiment was run in the same way as in Example 4 except that the vessel of Comparative Example 1 was employed. The faster the flow rate of the carrier gas, the lower was the concentration of trimethylindium. Results are shown in Table 5.

TABLE 5

| Time elapsed (min.) | Flow rate of the carrier gas (ml/min.) | Peak height in GC Example-5 | Comparative Example-5 |
| --- | --- | --- | --- |
| 0 | 10 | 319 | 228 |
| 15 | 10 | 321 | 231 |
| 30 | 10 | 318 | 238 |
| 45 | 20 | 315 | 210 |
| 60 | 20 | 318 | 230 |
| 75 | 20 | 318 | 235 |
| 90 | 50 | 317 | 165 |
| 105 | 50 | 315 | 207 |
| 120 | 50 | 320 | 201 |
| 135 | 100 | 315 | 160 |
| 150 | 100 | 317 | 127 |
| 165 | 100 | 318 | 183 |
| 180 | 10 | 318 | 190 |
| 195 | 10 | 315 | 156 |
| 210 | 10 | 319 | 209 |

Industrial Applicability

The invention represents a method for the film formation of semiconductor or superconductor by gas-phase deposition of an organic metal compound which enables flow control at a constant concentration and stable supply of such gas in entirely the same sense as in the case of the prior-art gas for the production of semiconductor such as silane and germane. The method can be said to be of very high industrial applicability.

We claim:

1. Supply equipment for stable supply of feed gas of an organic metal compound at a constant concentration which comprises a generally cylindrical vessel having a solid organic metal compound housed therein, said vessel comprising an upper cylinder supported on and extending upwardly from a smaller diameter, coaxial lower cylinder, an inlet tube communicating with said lower cylinder for providing carrier gas for vaporizing said organic metal compound, an outlet tube communicating with said upper cylinder for letting out the carrier gas substantially saturated with the vaporized organic metal compound, a room provided in the lower part of the lower cylinder of the vessel, said room being connected to said carrier gas inlet tube, a packet bed of a solid organic metal compound formed above said room and extending upwardly from said lower cylinder into said upper cylinder, and a partition with a plurality of pores in said lower cylinder partitioning said room and said packed bed, the carrier gas introduced into said room in said lower cylinder being passed through said partition to and through said packed bed whereby it becomes substantially saturated with the organic metal compound, said organic metal compound-saturated carrier gas emerging from said packed bed into said upper cylinder and exiting said equipment through said outlet tube.

2. Equipment according to claim 1 wherein the organic metal compound is solid.

3. Equipment according to claim 1 wherein the portion above the partition in the vessel is substantially filled with the organic metal compound.

4. Equipment according to claim 1 wherein the partition is a multipore plate.

5. Equipment according to claim 1 wherein the partition is a mesh.

6. Equipment according to claim 1 wherein the partition is a perforated plate.

7. Equipment according to claim 1 including a tapered section interconnecting said upper cylinder and lower cylinder.

8. Equipment according to claim 1 wherein the carrier gas inlet tube and the outlet tube are respectively provided with a valve.

9. Method for providing stable supply of feed gas substantially saturated with an organic metal compound which comprises soaking the equipment of claim 1 in a thermostatic chamber, introducing carrier gas into said lower cylinder through a carrier gas inlet tube maintained at a constant temperature sufficient to vaporize said solid organic metal compound, and flowing said carrier gas through said packed bed to vaporize said solid organic metal compound thereby substantially saturating the gas with the compound, said compound-saturated carrier gas emerging from said packed bed into said upper cylinder at a decreased gas flow rate relative to said gas flow rate through said lower cylinder for avoiding association of fine particles of said solid organic metal compound with said carrier gas as said compound-saturated carrier gas exits said vessel.

10. Method according to claim 9 wherein the gas substantially saturated with the organic metal compound is suitable for use as feed gas for film formation.

* * * * *